(12) United States Patent
Xie et al.

(10) Patent No.: US 9,568,616 B2
(45) Date of Patent: Feb. 14, 2017

(54) ARRAY CRYSTAL MODULE AND FABRICATION METHOD THEREOF

(71) Applicant: RAYCAN TECHNOLOGY CO., LTD. (SU ZHOU), Suzhou New District, Suzhou, Jiangs (CN)

(72) Inventors: Qingguo Xie, Jiangsu (CN); Chen Zeng, Jiangsu (CN); Daoming Xi, Jiangsu (CN)

(73) Assignee: RAYCAN TECHNOLOGY CO., LTD. (SU ZHOU), Suzhou New District, Suzhou, Jiangsu (CN)

( * ) Notice: Subject to any disclaimer, the term of this patent is extended or adjusted under 35 U.S.C. 154(b) by 0 days.

(21) Appl. No.: 14/916,699

(22) PCT Filed: Nov. 14, 2013

(86) PCT No.: PCT/CN2013/087119
§ 371 (c)(1),
(2) Date: Mar. 4, 2016

(87) PCT Pub. No.: WO2015/032130
PCT Pub. Date: Mar. 12, 2015

(65) Prior Publication Data
US 2016/0202361 A1   Jul. 14, 2016

(30) Foreign Application Priority Data
Sep. 8, 2013   (CN) .......................... 2013 1 0426359

(51) Int. Cl.
*G01T 1/202*   (2006.01)
*H01L 27/146*   (2006.01)
*G01T 1/20*   (2006.01)

(52) U.S. Cl.
CPC ............. *G01T 1/202* (2013.01); *G01T 1/2002* (2013.01); *H01L 27/14663* (2013.01); *H01L 27/14685* (2013.01)

(58) Field of Classification Search
CPC .. G01T 1/202; G01T 1/2002; H01L 27/14663; H01L 27/14685
See application file for complete search history.

(56) References Cited

U.S. PATENT DOCUMENTS 5,059,800 A * 10/1991 Cueman .................. G01T 1/202
                                                             250/367
6,087,663 A *  7/2000 Moisan ................. G01T 1/2002
                                                             250/367
(Continued)

FOREIGN PATENT DOCUMENTS

CN   101073019 A   11/2007
CN   101856236 A   10/2010
(Continued)

*Primary Examiner* — David Porta
*Assistant Examiner* — Faye Boosalis
(74) *Attorney, Agent, or Firm* — Knobbe Martens Olson & Bear LLP

(57) ABSTRACT

A crystal-array module includes a number of unit crystal strips. The three-dimensional shape of the crystal-array module is a frustum or a combination of a right quadrangular prism and the frustum. The frustum includes a first bottom face coupled with a photoelectric device and a first top face opposed to the first bottom face. The area of the first bottom face is smaller than that of the first top face. A fabrication method of the crystal-array module includes joining cut unit crystal strips or cut unit crystal strip arrays together.

18 Claims, 4 Drawing Sheets

(56) References Cited

U.S. PATENT DOCUMENTS

| | | |
|---|---|---|
| 2001/0040219 A1 | 11/2001 | Cherry et al. |
| 2009/0020706 A1 | 1/2009 | Sekiguchi et al. |
| 2010/0127178 A1 | 5/2010 | Laurence et al. |
| 2010/0264320 A1 | 10/2010 | Takayama et al. |

FOREIGN PATENT DOCUMENTS

| | | |
|---|---|---|
| CN | 101990643 A | 3/2011 |
| CN | 102129082 A | 7/2011 |
| CN | 102178542 A | 9/2011 |
| CN | 203414599 U | 1/2014 |
| JP | H 05-11060 A | 1/1993 |

\* cited by examiner

ARRAY CRYSTAL MODULE AND FABRICATION METHOD THEREOF

CROSS REFERENCE TO RELATED APPLICATION

This application is a national phase of International Application No. PCT/CN2013/087119, titled "ARRAY CRYSTAL MODULE AND FABRICATION METHOD THEREOF", filed on Nov. 14, 2013, which claims priority to Chinese patent application No. 201310426359.0 titled "ARRAY CRYSTAL MODULE AND FABRICATION METHOD THEREOF" and filed with the Chinese Patent Office on Sep. 8, 2013, which is incorporated herein by reference in its entirety.

FIELD

The disclosure relates to the field of positron emission tomography device, and particularly to a crystal-array module and a method for fabricating it.

BACKGROUND

A scintillation crystal is a material which can convert X-ray particles or γ-ray particles into visible light photons, including Bismuth Germanium Oxide (BGO), Sodium Iodide (NaI)(Tl), Caesium Iodide (CsI)(Tl), LSO/LYSO, $PbWO_4$(PWO) and so on. Scintillation crystals generally have characteristics such as strong absorptive capacity for a radiation, large optical output, and a linear relationship between the number of output photons and energy of the absorbed radiation.

A detector generally consists of the scintillation crystal and a photoelectric conversion device, and is applied to the field such as nuclear medicine field, environment monitoring field, customs security check field or geologic prospecting field. In the detector, the scintillation crystal absorbs energy of the radiation and generates a certain number of visible light photons associated with the absorbed energy. The photoelectric device is configured to receive the photons and convert the photons into an electrical signal, and the electrical signal is analyzed by a circuit to acquire energy, timing and other information of the radiation. The signal-to-noise ratio of the electrical signal directly correlates with the number of photons received by the photoelectrical device, and has a direct influence on performance of the detector. It is desired that the detector is so designed that all the photons generated in the scintillation crystal are able to be received and converted into the electrical signal, to improve the performance of the detector.

In the Positron Emission Tomography (PET), when more output light of the scintillation crystal gets into the photoelectric device, precision of acquiring information on energy of γ-photon can be enhanced, and therefore imaging quality is improved. Therefore, it is very important for improving performance of the PET system to seek for a method or a detecting structure in which the output light of the scintillation crystal gets into the photoelectric device as much as possible.

For an practical application, an array photoelectric conversion face having the large detection area is constructed by arranging multiple photoelectric conversion devices together. The current common photoelectric conversion device includes silicon photomultipliers, avalanche photodiodes, photomultipliers and so on. This kind of photoelectric conversion device has a photoelectric accepting window smaller than the overall surface thereof. A photoelectric detection dead zone exists in detection surface in a case that the array photoelectric conversion face is constructed by patching multiple photoelectric conversion devices together. Hence the photoelectric detection face is not continuous, and some regions can not accept the photons. For example, in FIG. 1, the area of active region 100 of the silicon photomultiplier is 3×3 $mm^2$, and the area of a whole package surface 200 thereof generally reaches 4×4 $mm^2$. In a case that such photoelectric conversion devices are used to constitute a photoelectric conversion array, the photoelectric detection face of the array is discontinuous, and package dead zones are formed between the discontinuous photoelectric detection area. Therefore, when a detector is constructed with this kind of photoelectric conversion array, in a case that a coupling mode in which a single crystal corresponds to multiple photoelectric devices is employed, a part of visible light photons formed in a crystal strip may reach the package dead zone and can not contribute to the effective electrical signal, which reduces the performance of the detector.

In view of this, in a practical application, crystal strips are often coupled to photoelectrical devices in a one-to-one relationship, and the crystal strips are arranged to construct an array. Information relating to the high-energy particle is acquired by detecting an output signal of the photoelectric device. Currently, there are mainly the following two ways for constructing a crystal-array for the application described above.

One way is to employ crystal strips each having the same size of the package of a photoelectric device to construct the array crystal. As shown in FIG. 2, the size of a single crystal strip 300 in the crystal-array is the same as an overall size of a single photoelectric device 400, an effective detection region 500 is then provided. Due to the existence of a detection dead zone of the photoelectric detector, a part of photons formed in the crystal can not be accepted by the photoelectric detector, and the performance of the detector is deteriorated. However, since the gap between crystal strips is small in the detector, the volume of the scintillation crystal for detecting a high-energy particle is large, and the detection efficiency is still relatively high.

Another way is to use a coupling mode in which a crystal strip 800 has the same size of an effective detection region 700 of a photoelectric device 600. As shown in FIG. 3, in this way, a light output face of the crystal strip is coupled to the effective detection region 700 of the photoelectric device perfectly. Therefore, the performance deterioration due to a detection dead zone of the photoelectric device is avoided. However, a gap between crystal strips is large, the volume of the scintillation crystal for detecting a high-energy particle is reduced, leading to the decline of detection efficiency.

Therefore, for the technical problem described above, it is desired to provide a crystal-array module having an improved structure to solve the defect described above.

SUMMARY

In view of this, an object of the disclosure is to provide a crystal-array module in which a problem of loss of light output from the crystal is solved effectively on the premise of guaranteeing the detection efficiency, and a method for fabricating the crystal-array module.

In order to realize the object described above, the disclosure provides the following technical solution.

A crystal-array module is provided, the crystal-array module is couple to a photoelectric device, and includes several unit crystal strips, and the crystal-array module has a three-dimensional shape of a frustum or a three-dimensional shape of a combination of a gengon and a frustum, the frustum is coupled to a photoelectric device, and the frustum includes a first bottom face coupled to the photoelectric device and a first top face opposite to the first bottom face, the area of the first bottom face being less than that of the first top face.

Preferably, the gengon is a right quadrangular prism, a hexagonal prism or a triangular prism.

Preferably, the frustum of each of the plurality of unit crystal strips includes a bevel edge provided at an end of the frustum where the frustum is coupled to the photoelectric device, and the frustums of two adjacent unit crystal strips form an inverted-V shape having an opening facing the photoelectric device.

Preferably, in a case that each of the plurality of unit crystal strips has the three-dimensional shape of the frustum, the first top face is parallel with the first bottom face.

Preferably, in a case that each of the plurality of unit crystal strips has the three-dimensional shape of the combination of the gengon and the frustum, the gengon and the frustum are integral.

Preferably, in a case that each of the plurality of unit crystal strips has the three-dimensional shape of the combination of the gengon and the frustum, each of the unit crystal strips is formed by coupling a gengon crystal strip to a frustum crystal strip.

Preferably, the gengon crystal strip is coupled to the frustum crystal strip via light guide, glass or crystal.

Preferably, the plurality of unit crystal strips are combined to construct a gengon crystal unit and a frustum crystal unit, the crystal-array module is formed by coupling the gengon crystal unit to the frustum crystal unit, the frustum crystal unit comprises a first bottom face coupled to the photoelectric device and a first top face opposite to the first bottom face, and the gengon crystal unit comprises a second bottom face coupled to the first top face and a second top face opposite to the second bottom face.

Preferably, the gengon crystal unit has a coupling face identical to that of frustum crystal unit in shape and area.

Preferably, the second bottom face is directly coupled to the first top face by using optical glue.

Preferably, the second bottom face is coupled to the first top face by a light guide material, a glass material or a crystal material.

Preferably, the first top face has a size and a shape identical to those of the second bottom face respectively.

Preferably, the first top face has a shape identical to that of the second bottom face, and the second bottom face has an area less than that of the first top face.

Preferably, the first bottom face is parallel with the second top face.

Preferably, the frustum crystal unit is replaced by a frustum glass unit or a frustum light guide unit.

Preferably, when forming the crystal-array by using the unit crystal strips, an optical reflective material is completely coated on a face of each of the crystal strips, which face adjoining an adjacent crystal strip, to optically isolate the crystal strips from each other.

Preferably, when forming the crystal-array by using the unit crystal strips, an optical reflective material is coated on a part of a face of each of the crystal strips, which face adjoining an adjacent crystal strip, to optically isolate the crystal strips from each other, and a windowing part is formed on other part of the face of each of the crystal strips, so that a part of visible light photons of one of the unit crystal strips get into another unit crystal strip through the windowing part.

A method for fabricating a crystal-array module is provided, including the following steps:

S1: processing crystal strip billets, to obtain unit crystal strips or unit crystal strip arrays;

S2: determining an inclination angle of the crystal and the thickness of a gengon part thereof;

S3: performing a die cutting on the unit crystal strip or the unit crystal strip array based on the inclination angle, so that the unit crystal strips or the unit crystal strip arrays have a three-dimensional shape of a frustum or a combination of a gengon and a frustum; and S4: joining the cut unit crystal strips or the cut unit crystal strip arrays together, to form a crystal-array module.

Preferably, in step S2, the inclination angle of the crystal and the thickness of a right quadrangular prism thereof are determined based on characteristics of a photoelectric device to be used and a predetermined performance index set for a detector.

Preferably, in step S2, the gengon is a right quadrangular prism, a hexagonal prism or a triangular prism.

Preferably, in step S3, in a case that the unit crystal strips or the unit crystal strip arrays have a three-dimensional shape of a frustum, the frustum comprises a first bottom face coupled to a photoelectric device and a first top face opposite to the first bottom face, the area of the first bottom face is less than that of the first top face, and the first top face is parallel with the first bottom face.

Preferably, in step S3, in a case that the unit crystal strips or the unit crystal strip arrays have a three-dimensional shape of a combination of a gengon and a frustum, the unit crystal strips or the unit crystal strip arrays are formed by die cutting to be integral.

Preferably, in step S3, in a case that the unit crystal strips or the unit crystal strip arrays have a three-dimensional shape of a combination of a gengon and a frustum, the unit crystal strips or the unit crystal strip arrays are formed by die cutting to be discrete, the gengon and the frustum are then coupled to each other.

Preferably, the frustum comprises a first bottom face coupled to a photoelectric device and a first top face opposite to the first bottom face, the gengon comprises a second bottom face coupled to the frustum and a second top face opposite to the second bottom face, and the first bottom face is parallel with the second top face.

Preferably, in step S3, in a case that the unit crystal strips or the unit crystal strip arrays have a three-dimensional shape of a combination of a gengon and a frustum, the frustum is replaced by glass or light guide.

Preferably, in step S3, in a case that the unit crystal strips or the unit crystal strip arrays have a three-dimensional shape of a combination of a gengon and a frustum, optical glue, light guide or glass is arranged between the gengon and the frustum to couple the gengon to the frustum.

Preferably, in step S4, when the unit crystal strips or the unit crystal strip arrays are joined to each other, an optical reflective material is completely coated on a face of each of the crystal strips, which face adjoining an adjacent crystal strip, to optically isolate the crystal strips from each other.

Preferably, in step S4, when the unit crystal strips or the unit crystal strip arrays are joined to each other, an optical reflective material is coated on a part of a face of each of the a crystal strips, which face adjoining an adjacent crystal strip, to optically isolate the crystal strips from each other, and a windowing part is formed on other part of the face of each of the crystal strips, so that a part of visible light photons of one of the unit crystal strips get into another unit crystal strip through the windowing part.

It may be seen from the technical solution described above that, in the crystal-array module in the embodiments of the invention, light from the crystal which would otherwise be lost on a photoelectric coupling face may be reflected to get into the photoelectric device because of the frustum, and a light output face of the crystal is reduced to correspond to the effective face of the photoelectric device. In this way, it not only guarantees the detection efficiency of the detector, but also enhances the number of photons getting into the photoelectric device, the problem of loss of light output from the crystal due to the effective area of the photoelectric conversion device less than the package area is solved effectively, the sensitivity of the detector and the precision of acquiring the information on the energy are therefore guaranteed, and the performance of the system is optimized. Meanwhile, by improving the joining mode between the crystal strips in the new-type crystal-array to introduce a windowing part, a part of visible light photons from an excited unit crystal strip will get into an adjacent unit crystal strip, and will be detected by a photoelectric device corresponding to the adjacent unit crystal strip, in this way, information on energy deposition of the excited unit crystal strip may be acquired based on a signal generated by the adjacent photoelectric device. In the method for fabricating a crystal-array module in the embodiments of the invention, the scintillation crystal can be cut and fabricated in high precision, and be assembled into the crystal-array having the structure described above.

BRIEF DESCRIPTION OF THE DRAWINGS

In order to illustrate technical solutions in embodiments of the present disclosure or the conventional technology more clearly, hereinafter drawings to be used in the description of the embodiments or the conventional technology will be introduced simply. Apparently, the drawings described below only describe some embodiments of the present disclosure, and other embodiments and drawings may be obtained based on the embodiments described by these drawings by those skilled in the art.

DETAILED DESCRIPTION

Figure 1:
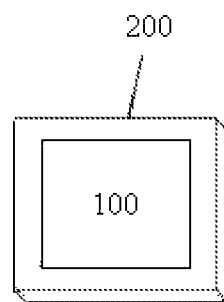
FIG. 1 is a schematic diagram of comparison of an effective detection region with a peripheral package of a silicon photomultiplier in the conventional art.
Figure 2:
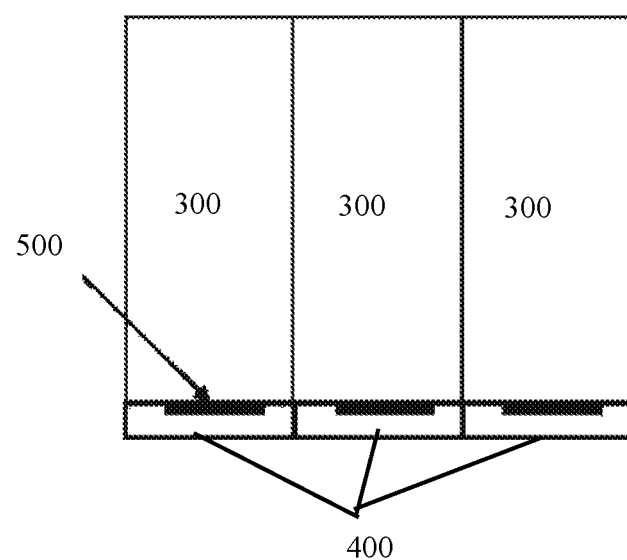
FIG. 2 is a schematic diagram in which a conventional crystal-array in the conventional art is coupled to a photoelectric device.
Figure 3:
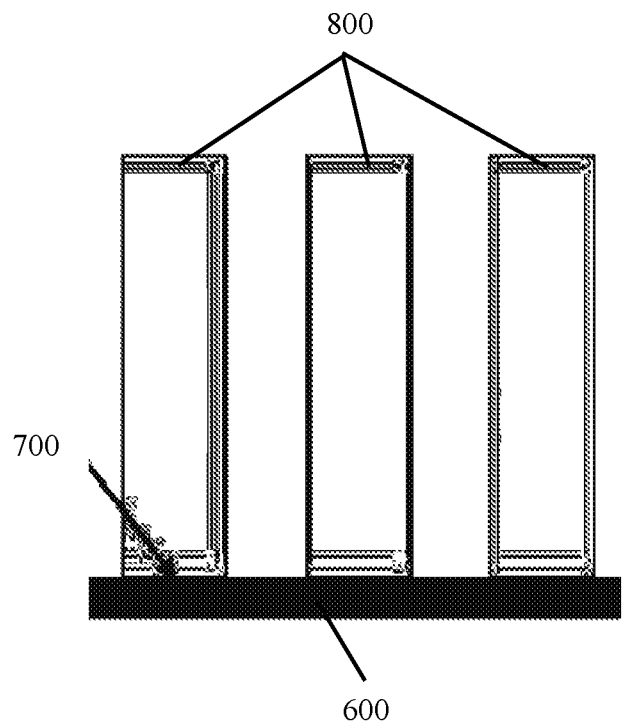
FIG. 3 is a schematic diagram in which a discrete crystal strip in the convention art is couple to a photoelectric device.

A crystal-array module is disclosed to solve the problem of loss of light output from the crystal due to the effective detection area less than the package area of a photoelectric conversion device on the premise of guaranteeing detection efficiency, so as to guarantee sensitivity and performance of the detector.

The crystal-array module is coupled to the photoelectric device, and includes several unit crystal strips, and the crystal-array module has a three-dimensional shape of a frustum or a three-dimensional shape of a combination of a gengon and a frustum, the frustum is coupled to the photoelectric device, and includes a first bottom face coupled to the photoelectric device and a first top face opposite to the first bottom face, the area of the first bottom face is less than that of the first top face.

The gengon is a right quadrangular prism, a hexagonal prism, a triangular prism or other shape.

The frustum of each unit crystal strip has a bevel edge provided at an end of the frustum where the frustum is coupled to the photoelectric device, and the frustums of two adjacent unit crystal strips form an inverted-V shape having an opening facing the photoelectric device.

In a case that each unit crystal strip has the three-dimensional shape of the frustum, the first top face is parallel with the first bottom face.

In a case that each unit crystal strip has the three-dimensional shape of the combination of the gengon and the frustum, the gengon and the frustum may have an integral structure or a discrete structure.

In a case that the gengon and the frustum have the discrete structure, the combination of the gengon and the frustum may be formed by coupling crystal strips, that is, by coupling a single gengon crystal strip and a single frustum crystal strip, in the end, the coupled crystal strips are assembled into the crystal-array module. The gengon crystal strip is coupled to the frustum crystal strip by light guide, glass or crystal.

Practically, the several unit crystal strips may be combined to construct a gengon crystal unit and a frustum crystal unit, and the gengon crystal unit and the frustum crystal unit are then coupled to each other. The frustum crystal unit includes a first bottom face coupled to the photoelectric device and a first top face opposite to the first bottom face, and the gengon crystal unit includes a second bottom face coupled to the first top face and a second top face opposite to the second bottom face. The second bottom face is directly coupled to the first top face by employing optical glue. Besides the optical glue, the second bottom face may also be coupled to the first top face by light guide, glass, crystal or other material. The size and shape of the first top face may be identical to that of the second bottom face respectively. Or, one of the size and the shape of the first top face may be identical to that of the second bottom face. For example, the shape of the first top face is identical to that of the second bottom face, but the area of the second bottom face is less than that of the first top face. The first bottom face is parallel with the second top face.

The shape and the area of a coupling face of the gengon crystal unit are identical to that of a coupling face of the frustum crystal unit respectively.

The frustum crystal unit may be replaced by a frustum glass unit or a frustum light guide unit.

When forming the crystal-array by employing the unit crystal strips, an optical reflective material may be completely coated on faces of the crystal strips, which faces adjoin adjacent crystal strips, to optically isolate the crystal strips from each other.

Practically, when forming the crystal-array by employing the unit crystal strips, the optical reflective material may be coated on a part of each of faces of the crystal strips, which faces adjoin adjacent crystal strips, to optically isolate the crystal strips from each other, and a windowing part is formed on other part of each of the faces of the crystal strips, so that a part of visible light photons of one of the unit crystal strips get into another unit crystal strip through the windowing part.

The disclosure further discloses a method for fabricating a crystal-array module, including:

S1: processing crystal strip billets, to obtain unit crystal strips or unit crystal strip arrays;

S2: determining an inclination angle of the crystal and the thickness of a gengon thereof;

S3: performing a die cutting on the unit crystal strips or the unit crystal strip arrays based on the inclination angle, so that the unit crystal strips or the unit crystal strip arrays have a three-dimensional shape of a frustum or a combination of a gengon and a frustum; and S4: joining the cut unit crystal strips or the cut unit crystal strip arrays together, to form a crystal-array module.

In step S2, the inclination angle of the crystal and the thickness of a right quadrangular prism thereof are determined based on characteristics of a photoelectric device used and a predetermined performance index set for the detector.

In step S2, the gengon is a right quadrangular prism, a hexagonal prism or a triangular prism.

In step S3, in a case that the unit crystal strips or the unit crystal strip arrays have a three-dimensional shape of a frustum, the frustum includes a first bottom face coupled to the photoelectric device and a first top face opposite to the first bottom face, the area of the first bottom face is less than that of the first top face, and the first top face is parallel with the first bottom face.

In step S3, in a case that the unit crystal strips or the unit crystal strip arrays have a three-dimensional shape of a combination of a gengon and a frustum, the unit crystal strips or the unit crystal arrays are formed by die cutting to be discrete.

In step S3, in a case that the unit crystal strips or the unit crystal strip arrays have a three-dimensional shape of a combination of a gengon and a frustum, the unit crystal strips or the unit crystal arrays are formed by die cutting to be discrete, the gengon and the frustum are then coupled with each other.

The frustum includes a first bottom face coupled to the photoelectric device and a first top face opposite to the first bottom face, and the gengon has a second bottom face coupled to the frustum and a second top face opposite to the second bottom face, the first bottom face is parallel with the second top face.

In step S3, in a case that the unit crystal strips or the unit crystal strip arrays have a three-dimensional shape of a combination of a gengon and a frustum, the frustum can be replaced by glass or light guide.

In step S3, in a case that the unit crystal strips or the unit crystal strip arrays have a three-dimensional shape of a combination of a gengon and a frustum, optical glue, light guide or glass is arranged between the gengon and the frustum to couple the gengon to the frustum.

In step S4, when unit crystal strips or unit crystal strip arrays are joined with each other, an optical reflective material is completely coated on faces of the crystal strips, which faces adjoin adjacent crystal strips, to optically isolate the crystal strips from each other.

In step S4, when the unit crystal strips or the unit crystal strip arrays are joined with each other, the optical reflective material may be coated on a part of each of faces of the crystal strips, which faces adjoin adjacent crystal strips, to optically isolate the crystal strips from each other, and a windowing part is formed in other part of each of the faces of the crystal strips, so that a part of visible light photons of one of the unit crystal strips get into another unit crystal strip through the windowing part.

Since the gengon may be a right quadrangular, a hexagonal prism, a triangular prism or other shape, any shape that may be formed by the die cutting will be in the scope of protection of the disclosure. Also, the method for fabricating the crystal module in the disclosure are the same for the right quadrangular, the hexagonal prism, the triangular prism or the other shape, the technical solution according to the embodiments of the disclosure will be described in detail below by taking the right quadrangular as an example of the gengon and in conjunction with drawings. Obviously, the described embodiments are only a part of embodiments of the invention, and are not all embodiments. Based on the embodiments of the invention, all other embodiments obtained by those skilled in the art without paying any creative work will fall within the scope of protection of the disclosure.

Figure 4:
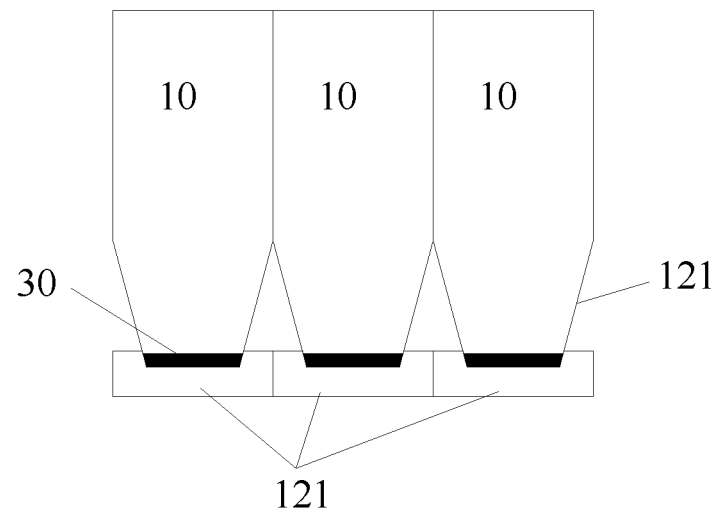
FIG. 4 is a schematic diagram in which a crystal-array module in the disclosure is coupled to a photoelectric device.
Figure 5:
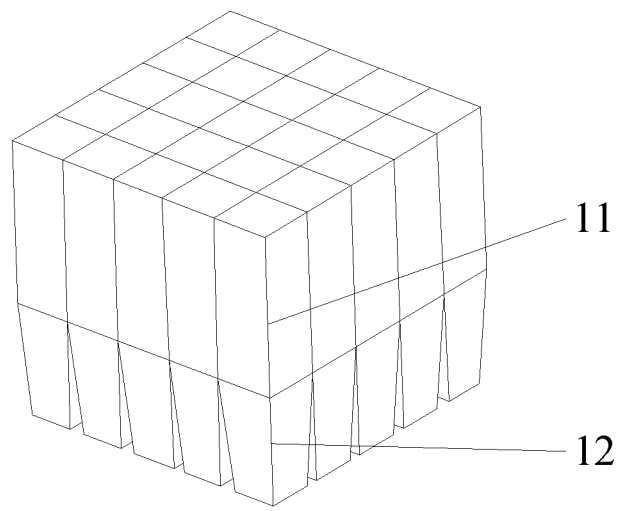
FIG. 5 is a schematic stereogram of a crystal-array module in the disclosure.
Figure 6:
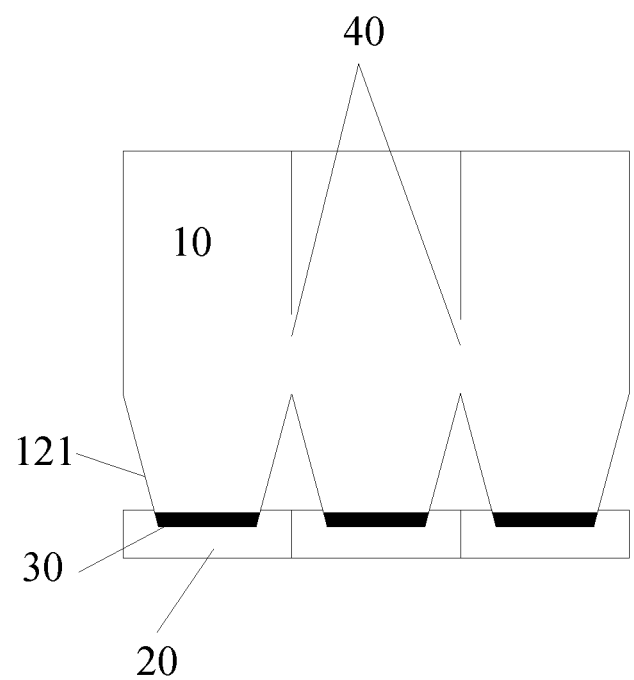
FIG. 6 is a schematic diagram of a windowing part of a crystal-array module in the disclosure.

As shown in FIG. 4 and FIG. 5, a crystal-array module disclosed herein is coupled to a photoelectric device. The crystal-array module includes several unit crystal strips 10. Each unit crystal strip 10 has a three-dimensional shape of a frustum 12 or a combination of a right quadrangular 11 and a frustum 12. The frustum 12 is coupled to the photoelectric device 20. An embodiment in which the right quadrangular is combined with the frustum is shown in the drawings of the disclosure. The scope of protection of the disclosure is not limited to the drawings, other technical solution including only frustums or any combination of gengons and frustums will also fall within the scope of protection of the disclosure.

As shown in FIG. 4, an inclination angle is provided at an end of the frustum 12 where the frustum 12 is coupled to the photoelectric device 20. That is, the frustum 12 of each unit crystal strip 10 includes a bevel edge 121 corresponding to the inclination angle, and the bevel edge 121 is arranged at an end of the frustum of each unit crystal strip where the frustum is coupled to the photoelectric device. Frustums of two adjacent unit crystal strips generate an inverted-V shape having an opening facing the photoelectric device. The inclination angle can be adjusted based on characteristic of the photoelectric device, so that light from the crystal which otherwise would be lost at the photoelectric coupling face 30 may be reflected to enter the photoelectric device 20. In this way, a light output face of the crystal is reduced to correspond to an effective face of the photoelectric device 20, which not only guarantees the detection efficiency of the detector, but also increases the number of photons entering the photoelectric device 20.

The frustum 20 includes a first bottom face coupled to the photoelectric device 20 and a first top face opposite to the first bottom face, the area of the first bottom face is less than that of the first top face. In a case that each unit crystal strip has a three-dimensional shape of a frustum, the first top face is parallel with the first bottom face. The first top face and the first bottom face are a rectangle, a circle, an oval or a polygon such as a regular hexagon or a regular pentagon, as long as the first top face and the first bottom face have a shape which may be formed by a cutting process and the area of the first top face (a face close to a detected source) is greater than that of the first bottom face (a face close to the photoelectric device).

In a case that each unit crystal strip 10 has a three-dimensional shape of a combination of a right quadrangular 11 and a frustum 12, the right quadrangular 11 and the frustum 12 may be integral, or may also be discrete.

In a case that the right quadrangular 11 and the frustum 12 have the discrete structure, the unit crystal strip is formed by coupling a right quadrangular crystal strip to a frustum crystal strip, and then the formed unit crystal strips are combined to further construct a crystal-array module. The polygon crystal strip is coupled to the frustum crystal strip by light guide, glass or a crystal.

In a case that the right quadrangular 11 and the frustum 12 have the discrete structure, several unit crystal strips may be combined to construct a right quadrangular crystal unit and a frustum crystal unit, and the right quadrangular crystal unit and the frustum crystal unit are coupled to construct a crystal-array module. The frustum crystal unit includes a first bottom face to be coupled to the photoelectric device and a first top face opposite to the first bottom face, and the right quadrangular crystal unit includes a second bottom face to be coupled to the first top face and a second top face opposite to the second bottom face.

The shape and the area of the coupling face of the right quadrangular crystal unit are identical to that of the coupling face of the frustum crystal unit respectively. The second bottom face is directly coupled to the first top face by using the optical glue. Or, the second bottom face is coupled to the first top face by using a light guide material, a glass material or a crystal material. The size and shape of the first top face may be identical to that of the second bottom face respectively. Or, one of the size and the shape of the first top face may be identical to that of the second bottom face, for example, the shape of the first top face is identical to that of the second bottom face, and the area of the second bottom face is less than that of the first top face. The first bottom face is parallel with the second top face. The frustum crystal unit may be replaced by a frustum glass unit or a frustum light guide unit.

In a case that the crystal-array is constructed by the unit crystal strips 10, an optical reflective material is coated on faces of the crystal strips where the crystal strips are connected to each other to optically isolate the crystal strips.

Alternatively, in a case that the crystal-array is constructed by the unit crystal strips 10, the optical reflective material is coated on a part of each of the faces of the crystal strips, at which faces the crystal strips are connected to each other, to perform the optical isolation process, and a windowing part 40 is formed on other part of each of the faces of the crystal strips so that a part of visible light photons of one of unit crystal strips get into another unit crystal strip through the windowing part 40. By improving the joining mode between the crystal strips in the new-type crystal-array and introducing a design for the windowing part 40, a part of visible light photons of an excited unit crystal strip 10 will enter an adjacent unit crystal strip 10, and will be detected by a photoelectric device 20 corresponding to the adjacent unit crystal strip 10, in this way, information on energy deposition of the excited unit crystal strip may be acquired based on a signal generated by the adjacent photoelectric device.

In a case that the right quadrangular 11 and the frustum 12 have the integral structure, the first top face and the first bottom become into one face.

In a case that the right quadrangular 11 and the frustum 12 have the discrete structure, the first top face and the first bottom face are two separated faces.

It may be seen from the technical solution described above that, in the crystal-array module of the embodiments of the invention, light from the crystal which would otherwise be lost on the photoelectric coupling face may be reflected to get into the photoelectric device because of the existence of the inclination angle, and the light output face of the crystal is reduced to correspond to the effective face of the photoelectric device. In this way, it not only guarantees the detection efficiency of the detector, but also enhances the number of photons getting into the photoelectric device, the problem of loss of light output from the crystal due to the effective area of the photoelectric conversion device less than the package area is solved effectively, the sensitivity of the detector and the precision of acquiring the information on the energy are therefore guaranteed, and the performance of the system is optimized. Meanwhile, by improving the joining mode between the crystal strips in the new-type crystal-array to introduce the windowing part, a part of visible light photons from an excited unit crystal strip will get into an adjacent unit crystal strip, and will be detected by a photoelectric device corresponding to the adjacent unit crystal strip, in this way, information on energy deposition of the excited unit crystal strip may be acquired based on a signal generated by the adjacent photoelectric device.

Figure 7:
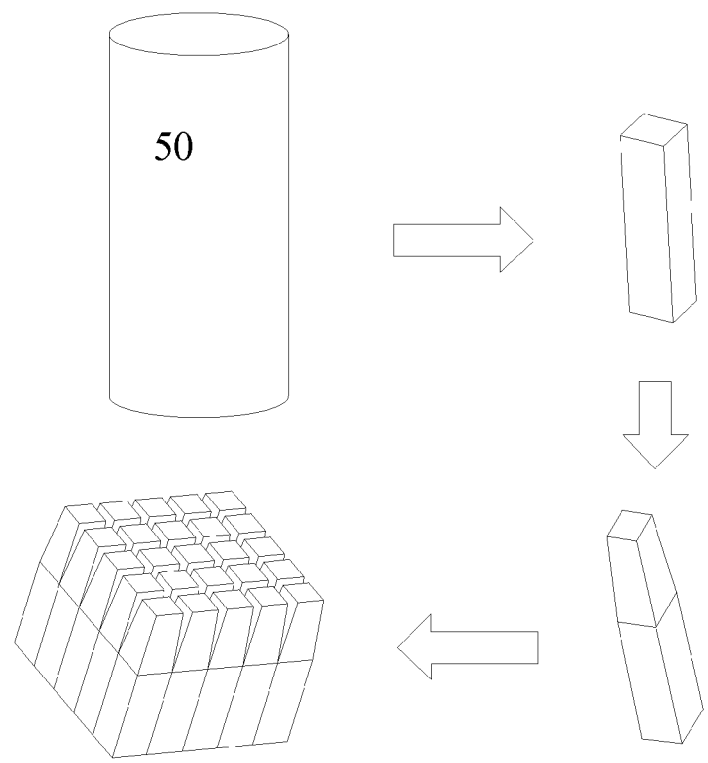
FIG. 7 is a schematic flow diagram of a method for fabricating a crystal-array module in the disclosure.

FIG. 7 is a flow chart of a method for fabricating a crystal-array module according to an embodiment of the invention, the method including the following steps:

S1: processing crystal strip billets, to obtain unit crystal strips or a unit crystal strip arrays;

S2: determining an inclination angle of the crystal and the thickness of a gengon thereof;

S3: performing a die cutting on the unit crystal strips or the unit crystal strip arrays based on the inclination angle, so that the unit crystal strips or the unit crystal strip arrays have a three-dimensional shape of a frustum or a combination of a gengon and a frustum; and S4: joining the cut unit crystal strips or the cut unit crystal strip arrays together, to form a crystal-array module.

When determining the inclination angle and the thickness of the right quadrangular in step S2, the characteristic of the photoelectric device and the predetermined index of the detector should be taken into account. For the photoelectric device, it is required to acquire information on the area of an effective working region and the area of a whole package region of the photoelectric device. In a case that a ratio of the effective detection area to the package area thereof is small, it is required to set the inclination angle of the crystal to be large. In addition, the design for the inclination angle will be influenced by characteristics such as a distance between a surface of the photoelectric device and a photoelectric conversion face thereof or a linear working domain. For the predetermined index of the detector, it is required to make clear which performance of a target detector is highlighted. For a scintillation crystal detector, the important index includes energy resolution, temporal resolution, sensitivity and so on. The energy resolution characterizes precision of acquiring energy by the detector for a detected ray, the temporal resolution characterizes precision of calibrating a time by the detector for a detected ray, and the sensitivity represents a detection efficiency of the detector for a ray having energy. In a case that high energy resolution is pursued, it is required that the number of output light photons from the crystal become large, then the inclination angle of the crystal can not be large; in a case that high temporal resolution is pursued, it is required that the number of a first batch of output light photons from the crystal to the photoelectric device becomes large, then it is required to limit the thickness of the crystal and the inclination angle; or in a case that high sensitivity is pursued, it is required to set the inclination angle to be large and set the right quadrangular to be thick.

In step S2, the inclination angle of the crystal and the thickness of the right quadrangular prism thereof are determined based on characteristics of a photoelectric device used and a predetermined performance index set for the detector.

In step S2, the gengon is a right quadrangular prism, a hexagonal prism or a triangular prism.

In step S3, in a case that the unit crystal strips or the unit crystal strip arrays have a three-dimensional shape of a frustum, the frustum includes a first bottom face coupled to the photoelectric device and a first top face opposite to the first bottom face, the area of the first bottom face is less than that of the first top face, the first top face is parallel with the first bottom face.

In step S3, in a case that the unit crystal strips or the unit crystal strip arrays have a three-dimensional shape of a combination of a gengon and a frustum, the unit crystal strips or the unit crystal strip arrays are formed by die cutting to be discrete.

In step S3, in a case that the unit crystal strips or the unit crystal strip arrays have a three-dimensional shape of a combination of a gengon and a frustum, the unit crystal strips or the unit crystal strip arrays are formed by die cutting to be discrete, the gengon and the frustum are then coupled with each other. The frustum includes a first bottom face coupled to the photoelectric device and a first top face opposite to the first bottom face, the right quadrangular has a second bottom face connected to the frustum and a second top face opposite to the second bottom face, the second bottom face is parallel with the second top face.

In step S3, in a case that each unit crystal strip or each unit crystal strip array has a three-dimensional shape of a combination of a gengon and a frustum, the frustum can be replaced by glass or light guide.

In step S3, in a case that each unit crystal strip or each unit crystal strip array has a three-dimensional shape of a combination of a gengon and a frustum, optical glue, light guide or glass is arranged between the right quadrangular and the frustum to couple the right quadrangular to the frustum.

In step S4, when unit crystal strips or unit crystal strip arrays are joined with each other, an optical reflective material is completely coated on faces of the crystal strips, which faces adjoin adjacent crystal strips, to optically isolate the crystal strips from each other.

In step S4, when unit crystal strips or unit crystal strip arrays are joined with each other, the optical reflective material is coated on a part of each of faces of the crystal strips, which faces adjoin adjacent crystal strips, to optically isolate the crystal strips from each other, and a windowing part is formed on other part of each of the faces of the crystal strips, so that a part of visible light photons of one of the unit crystal strips get into another unit crystal strip through the windowing part.

It may be seen from the technical solution described above that, in the method for fabricating a crystal-array module, the scintillation crystal can be cut and process in high precision, and then be assembled into a crystal-array module having the structure described above; in the method for fabricating a crystal-array module, the scintillation crystal can be cut and process in high precision, and then be assembled into a crystal-array module having the structure described above.

The design for the inclination angle and the thickness of the right quadrangular of the disclosure will be illustrated below by also taking the right quadrangular as an example and in conjunction with several specific embodiments.

First Embodiment

Figure 8:
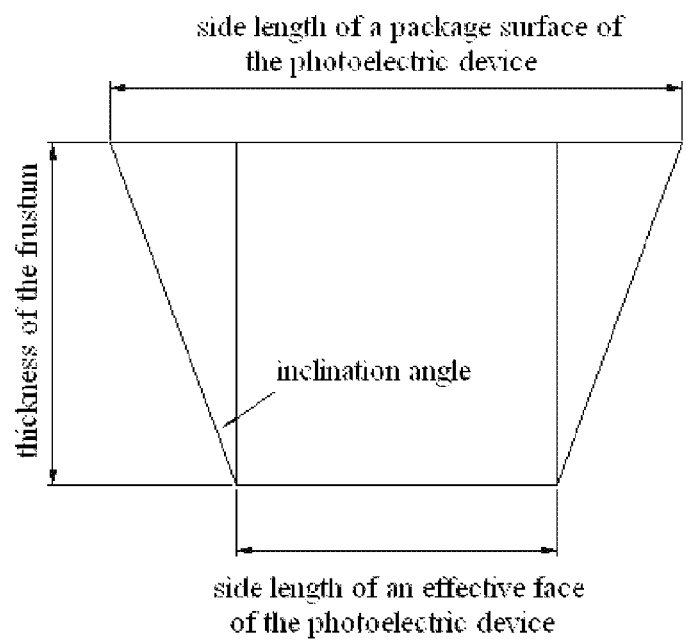
FIG. 8 is a plane diagram of a frustum in a crystal-array module in the disclosure.

A clinical PET detector is designed, the area of a package surface of a photoelectric device used is 4×4 $mm^2$, and the area of an effective working region is 3×3 $mm^2$, the designed detector aims to pursue high temporal resolution. The thickness of LYSO crystal commonly used by a current commercial clinical PET is generally between 20 mm to 35 mm. In a case that the thickness is small, the sensitivity is too low to satisfy a detection requirement. In a case that the thickness is large, the crystal is therefore too thick, transmission loss of visible light photons in the crystal will too large, the energy resolution and the temporal resolution will be reduced. Since the detector pursues the high temporal performance, the total thickness of the crystal is set to be from 20 mm to 22 mm. Also, in order to guarantee the sensitivity of the entire crystal for 511 KeV (energy of a ray to be detected by the PET) ray, the thickness of the right quadrangular prism is generally set to be from 10 mm to 17 mm. Then, the thickness of a frustum of the crystal equals to a difference obtained by subtracting the thickness of the right quadrangular prism from the total thickness, i.e. from 3 mm to 12 mm, it is required that a larger bottom face of the frustum corresponds to the package surface of the photoelectric device, i.e. the larger bottom face is 4×4 $mm^2$, and a smaller bottom face thereof corresponds to the effective area of the photoelectric device, i.e. the smaller bottom face is 3×3 $mm^2$. As shown in FIG. 8, it may be computed that the inclination angle equals to arctan (the thickness of the frustum/(side length of the package surface of the photoelectric device—side length of an effective face of the photoelectric device)), i.e. between 4-degree and 18-degree.

Second Embodiment

A nuclear radiation detector is designed, the area of a package surface of a photoelectric device used is 6×6 $mm^2$, and the area of an effective working region is 3×3 $mm^2$, the designed detector pursues high sensitivity. In order to enhance detection efficiency of the detector for a high-energy ray, the total thickness of the crystal is set to be from 38 mm to 40 mm, and the thickness of the right quadrangular prism is set to be from 30 mm to 35 mm. Similarly, it may be computed that an inclination angle is between 17 degree and 45 degree.

Therefore, it may be inferred that characteristics of the photoelectric device have the following influence on the inclination angle of the crystal and the thickness of the right quadrangular prism.

The smaller the ratio of the effective detection area of the photoelectric device to the package area thereof is, the larger the inclination angle of the crystal is. The thickness of the right quadrangular prism equals to a difference obtained by subtracting the thickness of the frustum from the total thickness of the crystal, and the thickness of the frustum is inverse proportional with the inclination angle of the crystal.

The predetermined performance index of the detector of the disclosure has the following influence on the inclination angle of the crystal and the thickness of the right quadrangular prism.

In a case that the detector requires the energy resolution to be large and light output to be large, it is to reduce the inclination angle of the crystal, and then light lost by being reflected by the inclination face will be reduced; or in a case that the detector requires the sensitivity to be high, the total thickness of the crystal is to be increased, and the thickness of the right quadrangular prism may also be increased. In a case that the detector requires both the energy resolution to be large and the sensitivity to be high, a range of the inclination angle of the crystal is between 2 degree and 15 degree, and the thickness of the right quadrangular prism is between 10 mm to 30 mm.

For those skilled in the art, the present disclosure is clearly not limited to the details of the above-described exemplary embodiments, and without departing from the spirit or essential characteristics of the present disclosure; the present disclosure can be achieved in other specific forms. Therefore, no matter from what point of view, the embodiments should be considered to be exemplary but not limiting. The scope of the present disclosure is defined by the appended claims rather than the above-described description; therefore, all changes falling within the meaning and range of an equivalent of the claims are intended to be included within the present disclosure. Any reference numeral in the claims should not be seen to restrict the referred claims.

Further, it should be understood that, although the present specification is described according to the embodiments, not every embodiment contains only a separate technical solution, this narrative mode is merely for the sake of clarity. Those skilled in the art should consider the specification as a whole; the technical solutions of each embodiment may be appropriately combined to form other embodiments which those skilled in the art can appreciate.

What is claimed is:

1. A crystal-array module coupled to a photoelectric device, the crystal-array module comprising a plurality of unit crystal strips,
   wherein the crystal-array module has a three-dimensional shape of a frustum or a combination of a gengon and a frustum, the frustum being coupled to the photoelectric device, and the frustum comprising a first bottom face coupled to the photoelectric device and a first top face opposite to the first bottom face, the area of the first bottom face being less than that of the first top face, and
   wherein when forming the crystal-array by using the unit crystal strips, an optical reflective material is coated on a part of a face of each of the crystal strips, which face adjoins an adjacent crystal strip, to optically isolate the crystal strips from each other, and a windowing part is formed on other part of the face of each of the crystal strips, so that a part of visible light photons of one of the unit crystal strips get into another unit crystal strip through the windowing part.

2. The crystal-array module according to claim 1, wherein the gengon is a right quadrangular prism, a hexagonal prism or a triangular prism.

3. The crystal-array module according to claim 1, wherein the frustum of each of the plurality of unit crystal strips comprises a bevel edge provided at an end of the frustum where the frustum is coupled to the photoelectric device, and the frustums of two adjacent unit crystal strips form an inverted-V shape having an opening facing the photoelectric device.

4. The crystal-array module according to claim 1, wherein in a case that each of the plurality of unit crystal strips has the three-dimensional shape of the frustum, the first top face is parallel with the first bottom face.

5. The crystal-array module according to claim 1, wherein in a case that each of the plurality of unit crystal strips has the three-dimensional shape of the combination of the gengon and the frustum, the gengon and the frustum are integral.

6. The crystal-array module according to claim 1, wherein in a case that each of the plurality of unit crystal strips has the three-dimensional shape of the combination of the gengon and the frustum, each of the unit crystal strips is formed by coupling a gengon crystal strip to a frustum crystal strip.

7. The crystal-array module according to claim 6, wherein the gengon crystal strip is coupled to the frustum crystal strip via light guide, glass or crystal.

8. The crystal-array module according to claim 1, wherein the plurality of unit crystal strips are combined to construct a gengon crystal unit and a frustum crystal unit, the crystal-array module is formed by coupling the gengon crystal unit to the frustum crystal unit, the frustum crystal unit comprises a first bottom face coupled to the photoelectric device and a first top face opposite to the first bottom face, and the gengon crystal unit comprises a second bottom face coupled to the first top face and a second top face opposite to the second bottom face.

9. The crystal-array module according to claim 8, wherein the second bottom face is directly coupled to the first top face by using optical glue.

10. The crystal-array module according to claim 8, wherein the first top face has a shape identical to that of the second bottom face, but the second bottom face has an area less than that of the first top face.

11. The crystal-array module according to claim 8, wherein the first bottom face is parallel with the second top face.

12. The crystal-array module according to claim 8, wherein the frustum crystal unit is replaced by a frustum glass unit or a frustum light guide unit.

13. A method for fabricating a crystal-array module, comprising:
   S1: processing crystal strip billets, to obtain unit crystal strips or unit crystal strip arrays;
   S2: determining an inclination angle of the crystal and a thickness of a gengon thereof;
   S3: performing a die cutting on the unit crystal strips or the unit crystal strip arrays based on the inclination angle, so that the unit crystal strips or the unit crystal strip arrays have a three-dimensional shape of a frustum or a combination of a gengon and a frustum; and
   S4: joining the cut unit crystal strips or the cut unit crystal strip arrays together, to form a crystal-array module,
   wherein in step S4, when the unit crystal strips or the unit crystal strip arrays are joined to each other, an optical reflective material is coated on a part of a face of each of the crystal strips, which face adjoins an adjacent crystal strip, to optically isolate the crystal strips from each other, and a windowing part is formed on other part of the face of each of the crystal strips, so that a part of visible light photons of one of the unit crystal strips get into another unit crystal strip through the windowing part.

14. The method for fabricating a crystal-array module according to claim 13, wherein in step S2, the inclination angle of the crystal and the thickness of a right quadrangular prism thereof are determined based on characteristics of a photoelectric device to be used and a predetermined performance index set for a detector.

15. The method for fabricating a crystal-array module according to claim 13, wherein in step S2, the gengon is a right quadrangular prism, a hexagonal prism or a triangular prism.

16. The method for fabricating a crystal-array module according to claim 13, wherein in step S3, in a case that the unit crystal strips or the unit crystal strip arrays have a three-dimensional shape of a frustum, the frustum comprises a first bottom face coupled to a photoelectric device and a first top face opposite to the first bottom face, the area of the first bottom face is less than that of the first top face, and the first top face is parallel with the first bottom face.

17. The method for fabricating a crystal-array module according to claim 13, wherein in step S3, in a case that the unit crystal strips or the unit crystal strip arrays have a three-dimensional shape of a combination of a gengon and a frustum, optical glue, light guide or glass is arranged between the gengon and the frustum to couple the gengon to the frustum.

18. A method for fabricating a crystal-array module, comprising the step of:
   S1: processing crystal strip billets, to obtain unit crystal strips or unit crystal strip arrays;
   S2: determining an inclination angle of the crystal and a thickness of a gengon thereof;
   S3: performing a die cutting on the unit crystal strips or the unit crystal strip arrays based on the inclination angle, so that the unit crystal strips or the unit crystal strip arrays have a three-dimensional shape of a frustum or a combination of a gengon and a frustum; and
   S4: joining the cut unit crystal strips or the cut unit crystal strip arrays together, to form a crystal-array module,
   wherein in step S4, when the unit crystal strips or the unit crystal strip arrays are joined to each other, an optical reflective material is completely coated on a face of each of the crystal strips, which face adjoins an adjacent crystal strip, to optically isolate the crystal strips from each other.

* * * * *